United States Patent [19]
Kim

[11] Patent Number: 5,744,389
[45] Date of Patent: Apr. 28, 1998

[54] METHOD FOR FABRICATING A SEMICONDUCTOR DEVICE HAVING A CAPACITOR

[75] Inventor: Dae Young Kim, Kyoungki-do, Rep. of Korea

[73] Assignee: Hyundai Electronics Industries Co., Ltd., Kyoungki-do, Rep. of Korea

[21] Appl. No.: 822,549

[22] Filed: Mar. 19, 1997

Related U.S. Application Data

[62] Division of Ser. No. 743,140, Nov. 4, 1996, Pat. No. 5,668,412, which is a continuation of Ser. No. 438,402, May 10, 1995, abandoned.

[30] Foreign Application Priority Data

May 11, 1994 [KR] Rep. of Korea ...................... 94-10271

[51] Int. Cl.⁶ .............................................. H01L 21/8242
[52] U.S. Cl. .................................... 438/253; 438/254
[58] Field of Search ................................. 438/238–241, 438/253–256, 396–397

[56] References Cited

U.S. PATENT DOCUMENTS

| | | |
|---|---|---|
| 4,656,732 | 4/1987 | Teng et al. . |
| 4,720,908 | 1/1988 | Wills . |
| 5,100,838 | 3/1992 | Dennison . |
| 5,164,337 | 11/1992 | Ogawa et al. ............................ 438/397 |
| 5,189,506 | 2/1993 | Cronin et al. . |
| 5,302,855 | 4/1994 | Matsumoto et al. . |
| 5,341,026 | 8/1994 | Harada et al. . |
| 5,346,844 | 9/1994 | Cho et al. ................................. 438/253 |
| 5,405,796 | 4/1995 | Jones, Jr. ................................. 438/253 |
| 5,442,238 | 8/1995 | Takata . |
| 5,444,020 | 8/1995 | Lee et al. . |
| 5,471,094 | 11/1995 | Lien . |
| 5,514,911 | 5/1996 | Kim . |
| 5,525,552 | 6/1996 | Huang . |

*Primary Examiner*—Jey Tsai
*Attorney, Agent, or Firm*—Morgan & Finnegan, L.L.P.

[57] ABSTRACT

A semiconductor device wherein an effective surface area is secured within a contact hole and wherein a storage electrode with rectangular corners is exactly patterned. The effective surface area within a contact hole can be obtained by overlapping the storage electrode contact hole with a portion of the storage electrode, so as to ensure more capacitance. Rounding of the corner of the rectangular storage electrode, which directs the resulting storage electrode to diminish in effective surface area, can be prevented by the different position of the storage electrode mask at the contact hole from one row or column to next, so as to make no difference between the patterned storage electrode and the designed one.

4 Claims, 5 Drawing Sheets

METHOD FOR FABRICATING A SEMICONDUCTOR DEVICE HAVING A CAPACITOR

This is a divisional of application Ser. No. 08/743,140 filed Nov. 4, 1996, U.S. Pat. No. 5,668,412, which is a Continuation of Ser. No. 08/438,402 filed May 10, 1995, abandoned.

BACKGROUND OF THE INVENTION

1. Field of the Invention

The present invention relates, in general, to a semiconductor device and, more particularly, to a security of large capacitance along with the semiconductor device. Also, the present invention is concerned with a method for fabricating the semiconductor device.

2. Description of the Prior Art

High integration of a semiconductor device demands a significant reduction in the area of a cell but a capacitance sufficient enough for the semiconductor device to perform its operation sufficiently. For the purpose of increasing the capacitance, a variety of capacitor structures, such as stack type, cylindrical type and trench type, has been suggested.

In order to better understand the background of the invention, a description for a stack structure of a capacitor will be given below, in connection with some of the accompanying drawings.

Referring to FIG. 1, there is a layout showing a conventional arrangement of a plurality of combinations, each of which consists of a rectangular storage electrode mask 16 and a circular storage electrode contact mask 10. As shown in this figure, the storage electrode mask 16 is centered at the storage electrode contact mask 10 and the combinations are arranged regularly in columns and rows.

FIG. 2 shows a storage electrode of a capacitor fabricated by the conventional technique, taken through line I—I of FIG. 1. Following the construction of a MOSFET (not shown) over a semiconductor substrate 1, an insulating layer 2 is formed over it and then, etched by use of the storage electrode contact mask (designated as reference numeral "10" in FIG. 1), so as to form a contact hole 3 through which a predetermined area of the semiconductor substrate 1 is exposed. A conductive layer for a storage electrode is deposited, followed by formation of an insulating layer (not shown) over the conductive layer. Using the storage electrode mask (designated as reference numeral "16" in FIG. 1), the insulating layer and the conductive layer are patterned by etch. At the side wall of the conductive layer and insulating film pattern thus obtained, a conductive spacer 9 is formed. And, the insulating film pattern upon the conductive layer pattern is removed. At the moment, the conductive layer pattern 8 is electrically connected with the conductive spacer 9 so that they both are used as a storage electrode.

Such conventional structure of a storage electrode cannot satisfy the demand for high integration because the securing of large capacitance is limited.

SUMMARY OF THE INVENTION

Therefore, it is a principal object of the present invention to overcome the above problems encountered in the prior art and to provide a semiconductor device having a novel storage electrode structure capable of securing a large capacitance.

It is another object of the present invention to provide the semiconductor device wherein an effective surface area can be obtained within a contact hole.

It is a further object of the present invention to provide the semiconductor device having a storage electrode with an exact rectangular corner.

It is still another object of the present invention to provide a method for the fabrication of a semiconductor device by which a large capacitance of a capacitor can be obtained.

In accordance with one aspect of the present invention, there is provided a semiconductor device wherein MOSFETs connected with as many capacitors are established in a semiconductor substrate, comprising: a lower insulating layer deposited over the MOSFETs with contact holes exposing each of the electrodes of the MOSFETs therethrough; and a plurality of storage electrodes, each of which comprises a conductive layer pattern and a conductive spacer, said conductive layer pattern being partly overlapped with the contact hole in electric contact with the electrode of the MOSFET, and said conductive spacer being formed at the side wall of the conductive layer pattern and extending straightly over the conductive layer pattern.

In accordance with another aspect of the present invention, there is provided a method for fabricating a semiconductor device, comprising the steps of: depositing a lower insulating layer over MOSFETs established in a semiconductor substrate; selectively etching the lower insulating layer by use of a storage electrode contact mask, to form a plurality of contact holes which are regularly arranged in both rows and columns; depositing a conductive layer for a storage electrode and an insulating layer, in sequence; subjecting the insulating layer and the conductive layer to etch by use of a storage electrode mask, to form a plurality of stack structures, each of which consists of an insulating layer pattern and a conductive layer pattern, said storage electrode mask being so arranged as to overlap partly with each of the contact holes; forming a conductive layer spacer at each side wall of the stack structures; and removing the insulating layer patterns from the stack structures, to form a plurality of storage electrodes.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1:
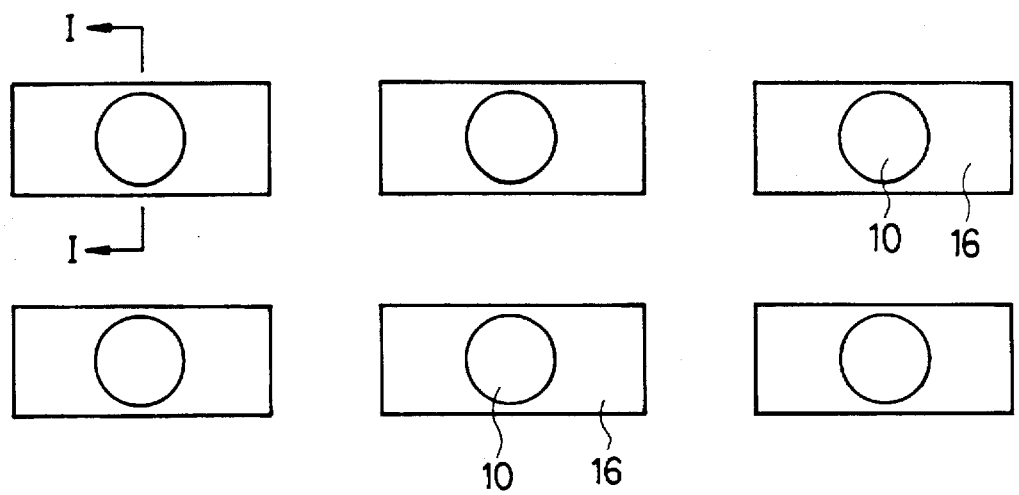
FIG. 1 is a layout showing a conventional arrangement of a plurality of combinations, each of which consists of a rectangular storage electrode mask and a circular storage electrode contact mask.
Figure 2:
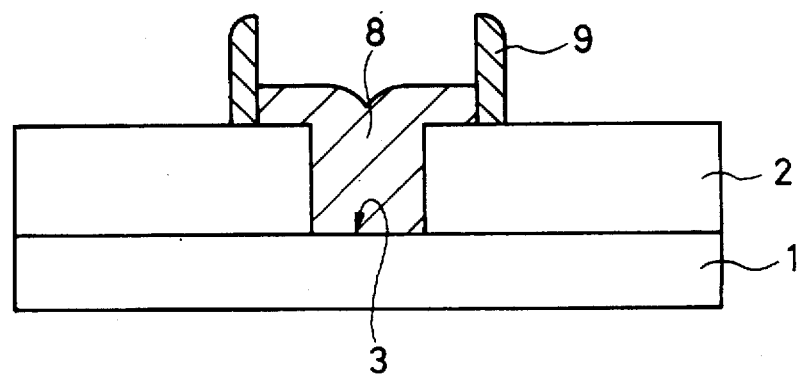
FIG. 2 is a schematic cross sectional view showing a storage electrode of a capacitor fabricated by a conventional technique, taken through line I—I of FIG. 1.

The application of the preferred embodiments of the present invention is best understood with reference to the accompanying drawings, wherein like reference numerals are used for like and corresponding parts, respectively.

Figure 3:
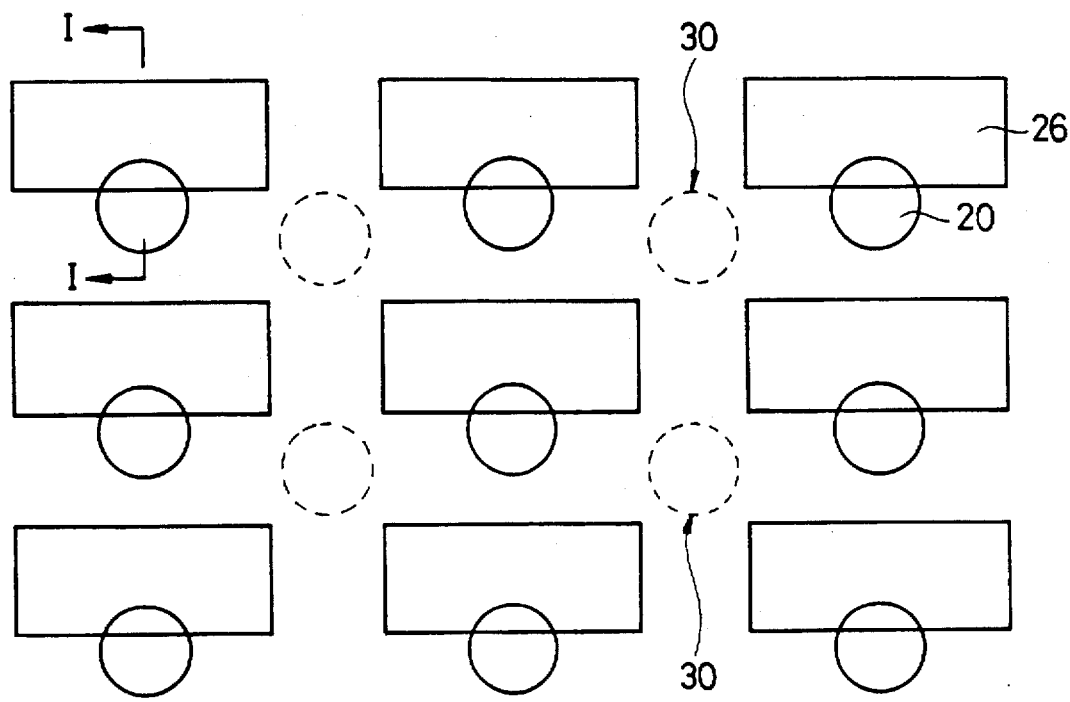
FIG. 3 is a layout showing an arrangement of a plurality of combinations, each of which consists of a rectangular storage electrode mask and a circular storage electrode contact mask, according to an embodiment of the present invention.

Referring to FIG. 3, there is a layout showing an arrangement of a plurality of combinations, each of which consists of a rectangular storage electrode mask 26 and a circular storage electrode contact mask 20, in accordance with an embodiment of the present invention. As shown in this figure, the rectangular storage electrode masks 26 are arranged regularly in rows and columns and there is one circular storage electrode contact mask 20 overlapped with each of the storage electrode masks 26 at its lower portion.

Figure 4:
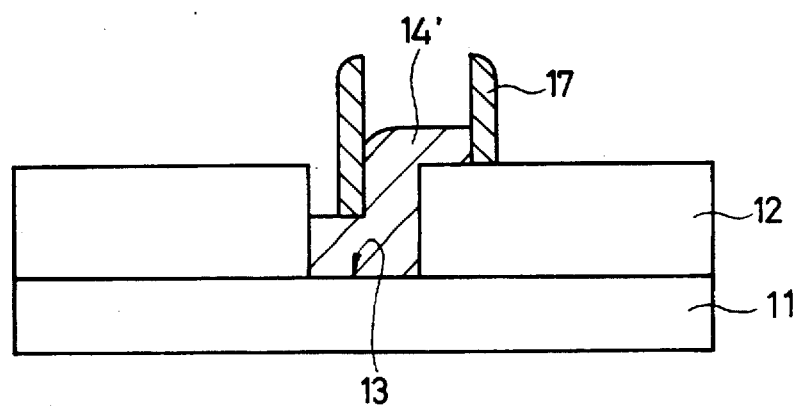
FIG. 4 is a schematic cross sectional view showing a storage electrode of a capacitor according to an embodiment of the present invention, taken through line I—I of FIG. 3.

FIG. 4 shows a storage electrode of a capacitor fabricated by a method according to the present invention, taken through line I—I of FIG. 3. The fabrication of the storage electrode starts with the construction of a MOSFET (not shown) over a semiconductor substrate 11. Thereafter, an insulating layer 12 is formed over it and then, etched by use of the storage electrode contact mask (designated as reference numeral "20" in FIG. 3), so as to form a contact hole 13 through which a predetermined area of the semiconductor substrate 11 is exposed. A conductive layer for storage electrode is deposited, followed by formation of an insulating layer (not shown) over the conductive layer. Using the storage electrode mask (designated as reference numeral "26" in FIG. 3), the insulating layer and the conductive layer are patterned by etch. At the side wall of the conductive layer and insulating film pattern thus obtained, a conductive spacer 17 is formed. And, the insulating film pattern upon the conductive layer pattern 14' is removed. Herein, the conductive layer pattern 14' and the conductive spacer 17 both are used as a storage electrode which is structured to be of larger surface area than the above illustrated conventional storage electrode.

The fabrication of the storage electrode of FIG. 4 will be in more detail described, in connection with FIGS. 5 through 8.

Figure 5:
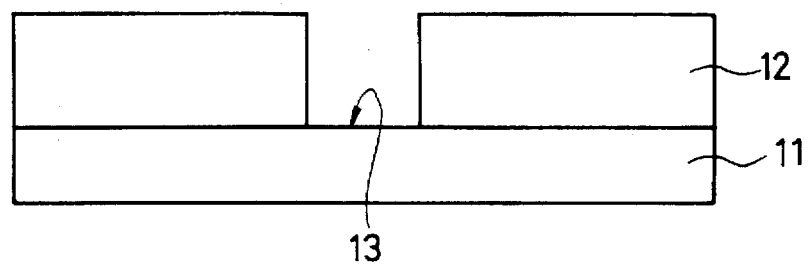
FIGS. 5 through 8 are schematic cross sectional views showing a method for fabricating a DRAM capacitor, according to the present invention.

First, FIG. 5 shows that, following construction of a MOSFET (not shown) over a semiconductor substrate 11, a lower insulating layer 12 is formed and then, subjected to etch, so as to form a contact hole 13 through which a predetermined area of the semiconductor substrate 11 is exposed. In this selective etch process, the storage electrode contact mask (designated as reference numeral "20" in FIG. 3) is used.

Figure 6:
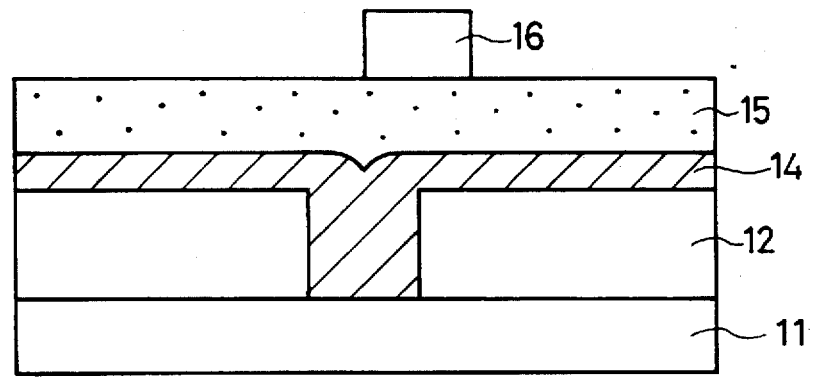

FIG. 6 is a cross section after a conductive layer 14 and a blanket insulating film 15 are sequentially deposited over the resulting structure of FIG. 5, followed by the formation of a photosensitive film pattern 16 upon a predetermined area of the insulating film 15. The conductive layer 14, for example, polysilicon is so thickly deposited that it may fill the contact hole 13. As for the photosensitive film pattern 16, a photosensitive film is deposited upon the insulating film 16 and subjected to exposure and development using the storage electrode mask (designated as reference numeral "26" in FIG. 3). BPSG (Boro Phosphor Silicate Glass), TEOS (Tetra Ethyl Oxide Silicate), $O_3$-PSG ($O_3$-Phosphor Silicate Glass) or PSG (Phosphor Silicate Glass) may be used as the insulating film 15.

Figure 7:
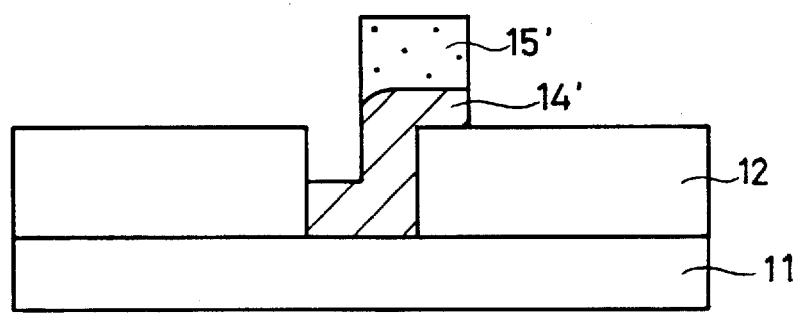

FIG. 7 is a cross section after, using the photosensitive film pattern as a mask, the insulating layer 15 and the conductive layer 14 are selectively etched until the lower insulating layer 12 is exposed, so as to form an insulating film pattern 15' and a conductive layer pattern 14', followed by removal of the photosensitive film pattern 16.

Figure 8:
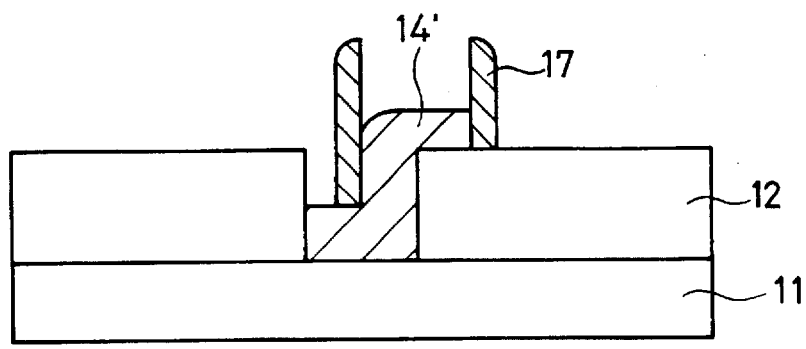

FIG. 8 is a cross section after a conductive spacer 17 is formed at the side wall of the conductive layer pattern 14' and insulating layer pattern 15', followed by removal of the insulating layer pattern 15'. The resulting structure consisting of the conductive layer pattern 14' and the conductive spacer 17 is used as a storage electrode whose surface area is more increased than that of the storage electrode fabricated by use of the conventional arrangement of the masks.

For completion of the capacitor, a dielectric film is coated upon the surface of the storage electrode, followed by formation of a plate electrode over the dielectric film.

Figure 9:
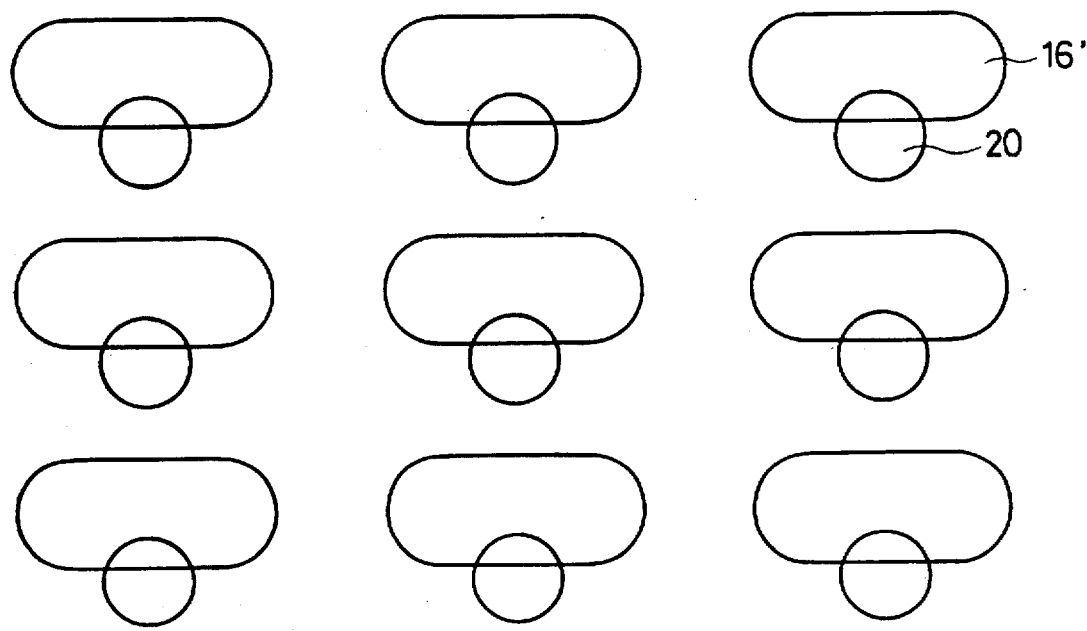
FIG. 9 is a top view showing round photosensitive film patterns that may be formed by use of the photosensitive film masks of FIG. 3.

Referring to FIG. 9, there are shown photosensitive film patterns 16' that may be formed round when the photosensitive film masks 26 of FIG. 3 are used. This results in a lesser surface area of the storage electrode than is originally designed when the lithography process is undertaken. These round photosensitive film patterns 16' are attributed to a fact that, when light is illuminated upon the photosensitive film in the presence of the photosensitive film pattern masks 26, it may be intensified at the crossroads 30 (represented by dotted line in FIG. 3), resulting in exposure of the corners of the rectangles.

Figure 10:
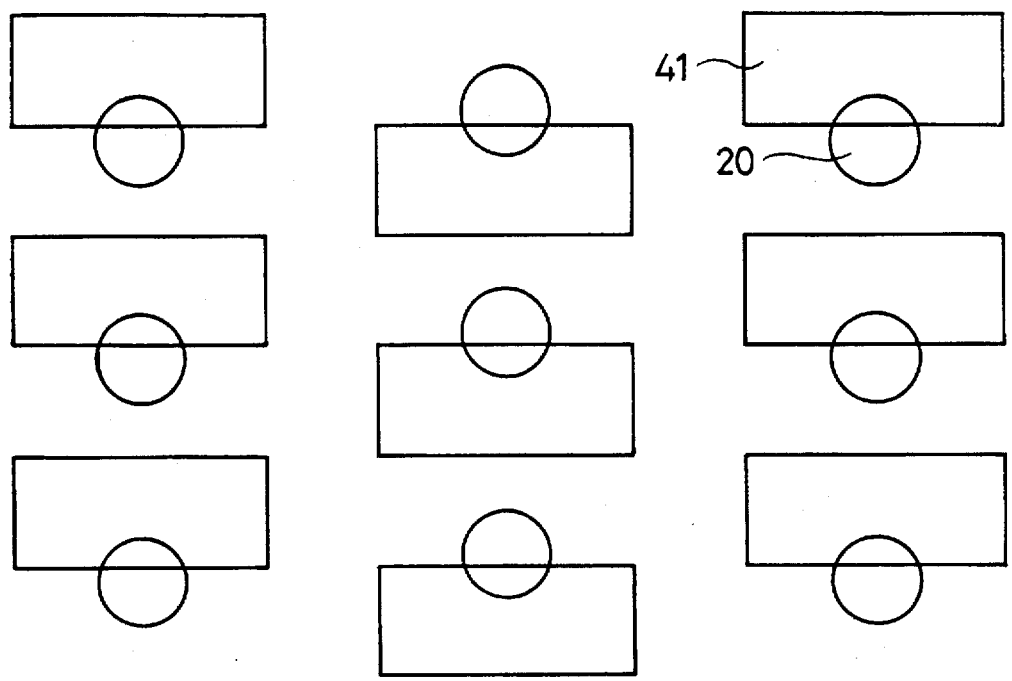
FIG. 10 is a layout showing an arrangement of a plurality of combinations, each of which consists of a rectangular storage electrode mask and a circular storage electrode contact mask, according to another embodiment of the present invention.
Figure 11:
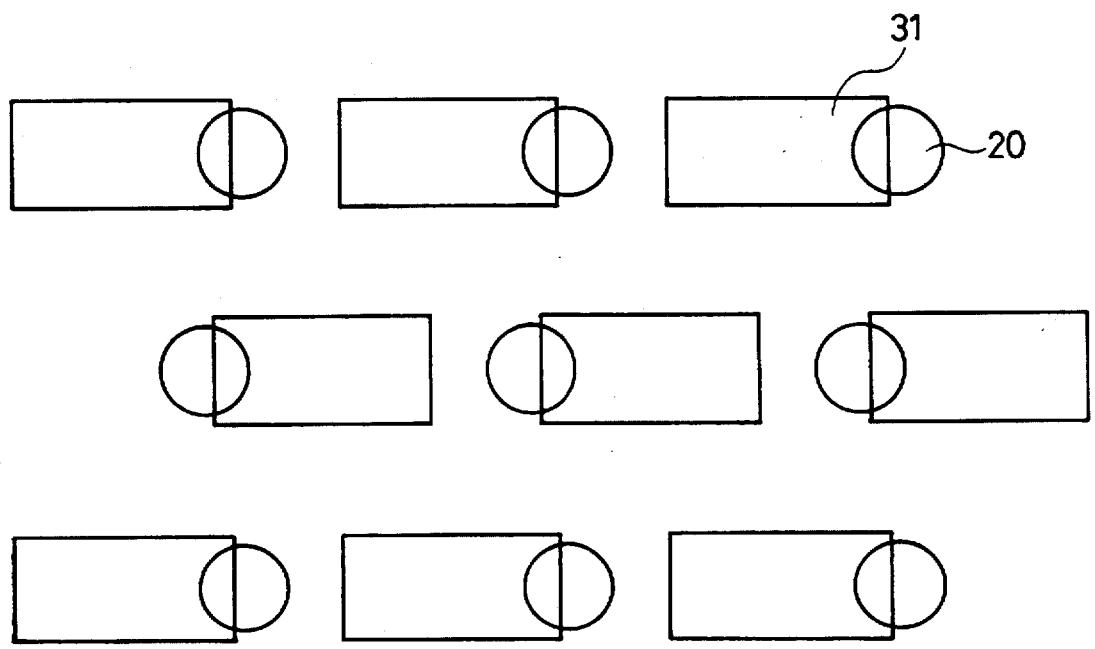
FIG. 11 is a layout showing an arrangement of a plurality of combinations, each of which consists of a rectangular storage electrode mask and a circular storage electrode contact mask, according to a further embodiment of the present invention.

In order to prevent the formation of the round photosensitive film pattern, different arrangements of a plurality of combinations, each of which consists of a rectangular storage electrode mask and a circular storage electrode contact mask are suggested as shown in FIGS. 10 and 11, in accordance with the present invention.

Referring to FIG. 10, a plurality of circular contact hole masks 20 are regularly arranged in rows and columns as in FIG. 3. However, in contrast with in FIG. 3, each of the contact hole masks 20 is overlapped with a storage electrode mask 41 either at its upper portion in odd columns or at its lower portion in even columns. So, the positions of the resulting storage electrode at the contact hole are opposite to each other in nearby columns, preventing formation of the crossroads.

Alternatively, the rectangular storage electrode mask may be positioned at either side of the circular contact hole mask. With reference to FIG. 11, a plurality of circular contact hole masks 20 are regularly arranged in rows and columns with each of which a storage electrode mask 31 is overlapped either at the left side of the contact hole mask in odd rows or the light side in even rows. Thus, such crossroads as in FIG. 3 are not formed. Consequently, the rounding of the corner of the rectangular photosensitive film pattern which directs the resulting storage electrode to diminish in effective surface area can be prevented by the different position of the storage electrode mask at the contact hole from one row or column to the next because the intensity of light becomes virtually uniform in all regions of the photosensitive film.

As described hereinbefore, the storage electrode according to the present invention is structured to accumulate charges within a contact hole by overlapping the storage electrode with the contact hole not completely as in the conventional storage electrode but partly. Accordingly, the effective surface area of a storage electrode can be made even within a contact hole, thereby increasing the capacitance of a capacitor.

A lesser capacitance than is originally designed may occur, which is attributed to a fact that, when a photosensitive film masked by rectangular storage electrode masks that are arranged regularly in both rows and columns is illuminated by light with the aim of obtaining photosensitive film patterns of the same shape as those of the storage electrode masks, the resulting photosensitive film patterns are rounded because the light is intensified at the crossroads among the rectangular storage electrode masks. This reduction in capacitance can be avoided by removal of the crossroads through opposite positioning of the rectangular storage electrode masks in one row or column to the adjacent one.

What is claimed is:

1. A method for fabricating a semiconductor device, comprising the steps of:

depositing a lower insulating layer over MOSFETs established in a semiconductor substrate;

selectively etching the lower insulating layer by use of a storage electrode contact mask, to form a plurality of contact holes which are regularly arranged in both rows and columns;

depositing a conductive layer for a storage electrode and an insulating layer, in sequence;

subjecting the insulating layer and the conductive layer to etch by use of a storage electrode mask, to form a plurality of stack structures, each of which consists of an insulating layer pattern and a conductive layer pattern, said storage electrode mask being so arranged as to overlap partly with each of the contact holes;

forming a conductive layer spacer at each side wall of the stack structures; and removing the insulating layer patterns from the stack structures, to form a plurality of storage electrodes.

2. A method in accordance with claim 1, wherein the conductive layer pattern for a storage electrode is overlapped with about a half of the contact hole.

3. A method in accordance with claim 1, wherein the overlapping side of the contact holes in even columns is opposite to that in odd columns.

4. A method in accordance with claim 1, wherein the overlapping side of the contact holes in even rows is opposite to that in odd rows.

* * * * *